(12) United States Patent
Peng et al.

(10) Patent No.: US 9,320,175 B2
(45) Date of Patent: Apr. 19, 2016

(54) SERVER CABINET

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Wen-Tang Peng, New Taipei (TW); Xiao-Zheng Li, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/525,793

(22) Filed: Oct. 28, 2014

(65) Prior Publication Data

US 2015/0296664 A1   Oct. 15, 2015

(30) Foreign Application Priority Data

Apr. 11, 2014 (CN) .................. 2014 1 01443327

(51) Int. Cl.
*G06F 1/20* (2006.01)
*H05K 7/20* (2006.01)
*H05K 5/00* (2006.01)

(52) U.S. Cl.
CPC ........ *H05K 7/20736* (2013.01); *H05K 7/20727* (2013.01)

(58) Field of Classification Search
CPC ........... G06F 1/20; G06F 1/203; G06F 1/206; H05K 7/20536; H05K 7/20703; H05K 7/20718; H05K 7/20727; H05K 7/20736

USPC ................. 361/724, 725, 726, 727, 679.46, 361/679.48, 679.49, 679.5; 454/188, 193
See application file for complete search history.

(56) References Cited

U.S. PATENT DOCUMENTS

| | | | | |
|---|---|---|---|---|
| 6,185,098 B1* | 2/2001 | Benavides | ........... | H05K 7/1488 174/387 |
| 6,294,762 B1* | 9/2001 | Faries, Jr. | ............. | A61F 7/0241 126/21 A |
| 7,385,810 B2* | 6/2008 | Chu | ...................... | H05K 7/2079 165/104.33 |
| 7,643,285 B2* | 1/2010 | Nishiyama | ................ | G06F 1/20 361/679.48 |
| 7,950,244 B2* | 5/2011 | Iyengar | .............. | H05K 7/20781 165/80.4 |
| 7,963,118 B2* | 6/2011 | Porter | ................ | H05K 7/20827 361/696 |
| 8,845,403 B2* | 9/2014 | Archibald | ............... | G06F 1/206 454/184 |
| 2003/0147214 A1* | 8/2003 | Patel | ........................ | G06F 1/20 361/699 |
| 2005/0153649 A1* | 7/2005 | Bettridge | ........... | H05K 7/20736 454/188 |

* cited by examiner

*Primary Examiner* — Anthony Haughton
(74) *Attorney, Agent, or Firm* — Novak Druce Connolly Bove + Quigg LLP (57) ABSTRACT

A server cabinet includes a bottom side, a top side, a first side wall, a second side wall opposite to the first side wall, a first air inlet tube with a number of air outlets, a second air inlet tube with a number of air outlets, and a number of pairs of adjusting apparatuses. The first air inlet tube is attached to the first side wall and extends from the bottom side to the top side, the second air inlet tube is attached to the second side wall and extends from the bottom side to the top side and the top side and the bottom side are each configured with an opening to receive the first air inlet tube and the second air inlet tube. Each air adjusting apparatus comprises a slidable shielding plate substantially covering the corresponding air outlets.

20 Claims, 10 Drawing Sheets

SERVER CABINET

FIELD

The subject matter herein generally relates to a server cabinet.

BACKGROUND

A server cabinet includes a cabinet and many servers can be arranged in the cabinet. It is well known that the servers in such an arrangement may generate a considerable amount of heat during operation, particularly when they densely occupy the cabinet space. If the heat is not efficiently removed, the servers may suffer damage. Thus, heat dissipation for the cabinet is very important.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to a server cabinet.

Figure 1:
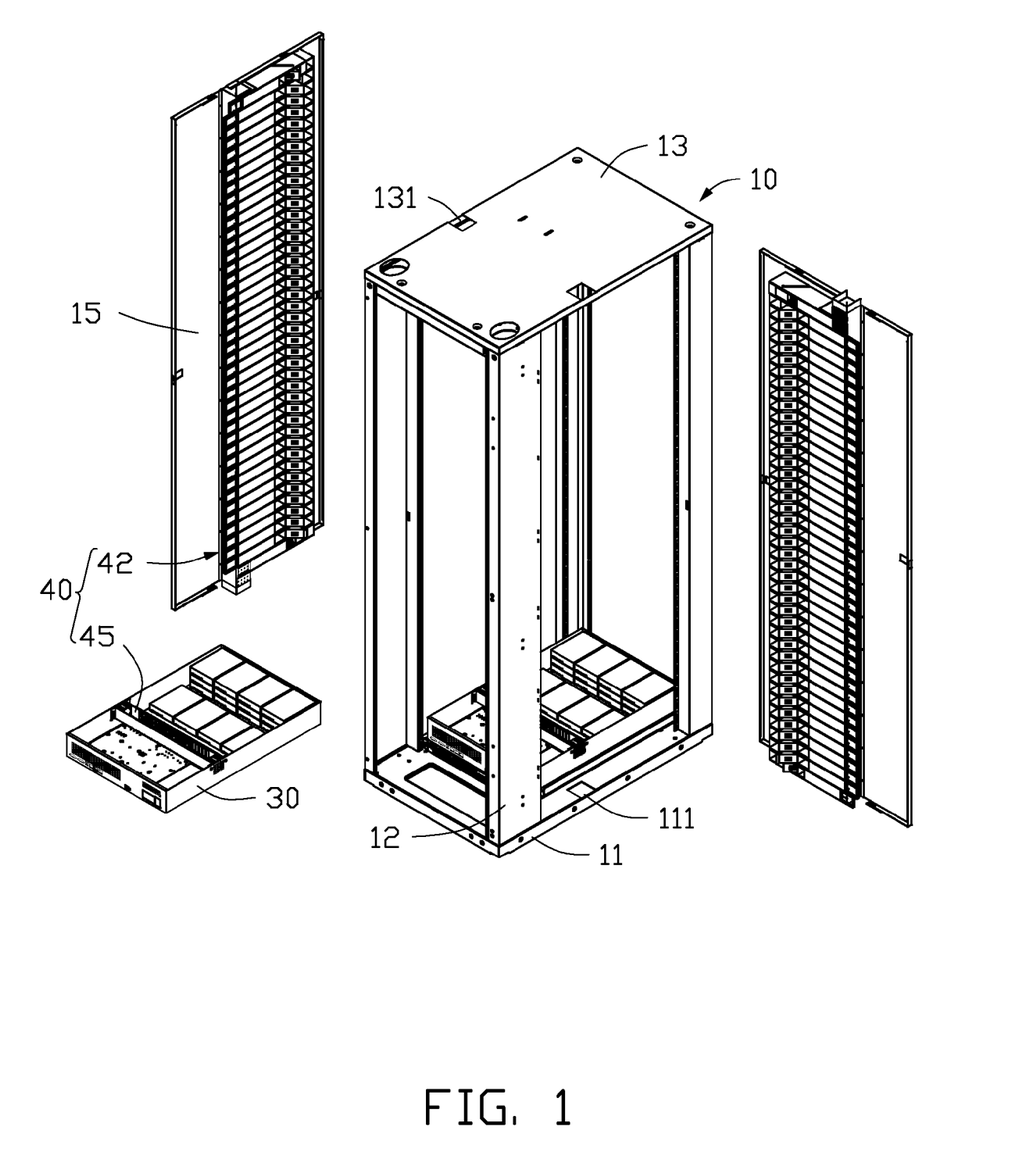
FIG. 1 is an exploded, isometric view of an embodiment of a server cabinet, wherein the server cabinet includes a cabinet, a plurality of servers and two ventilation apparatuses.

FIG. 1 illustrates an embodiment of a server cabinet comprising a cabinet 10, a plurality of servers 30 configured to be received in the cabinet 10, and a ventilation system 40. The ventilation system 40 comprises two ventilation apparatus 42 and a plurality of air absorbing apparatuses 45.

The cabinet 10 comprises a substantially rectangular bottom wall 11, four supporting poles 12 substantially perpendicularly extending up from four corners of the bottom wall 11, a top wall 13 mounted on top ends of the supporting poles 12, and two opposite side walls 15 mounted beside two sides of the supporting poles 12. The ventilation apparatus 42 are mounted to inner surfaces of the side walls 15. The top wall 13 defines two opposite first through holes 131 in middles of opposite sides of the top wall 13. The bottom wall 11 defines two opposite second through holes 111 in middles of opposite sides of the bottom wall 11. The first through holes 131 are aligned with the second through holes 111.

Figure 2:
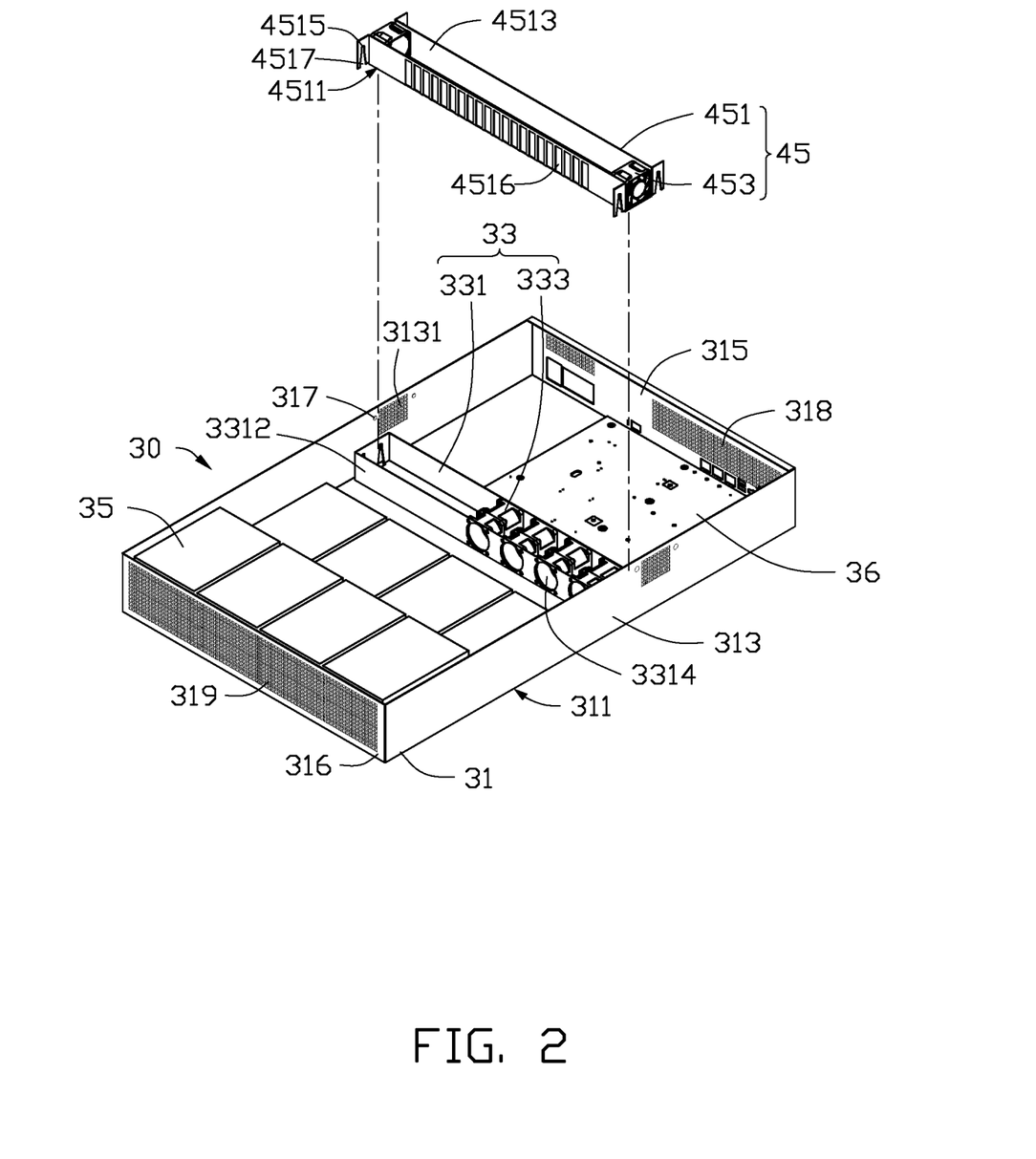
FIG. 2 is an enlarged, isometric view of one of the servers of FIG. 1.

FIG. 2 illustrates that each server 30 comprises a chassis 31, a dissipating assembly 33 received in a middle of the chassis 31, a plurality of hard disk drives 35 received in a rear of the chassis 31, a motherboard 36 received in a front of the chassis 31. The dissipating assembly 33 is located between the hard disk drives 35 and the motherboard 36. The chassis 31 comprises a substantially rectangular bottom plate 311, two opposite side plates 313 substantially perpendicularly extending up from two opposite sides of the bottom plate 311, a front plate 315 substantially perpendicularly extending up from a front side of the bottom plate 311 and coupled to the side plates 313, and a rear plate 316 substantially perpendicularly extending up from a rear side of the bottom plate 311 and coupled to the side plates 313.

The dissipating assembly 33 comprises a substantially rectangular receiving shell 331 supported on a middle of the bottom plate 311 and a plurality of fans 333 installed to the receiving shell 331. Two opposite ends of the receiving shell 331 are substantially perpendicularly mounted to lower portions of the side plates 313. The receiving shell 331 comprises two opposite position plates 3312 substantially perpendicular to the side plates 313. The position plates 3312 define a plurality of ventilation holes 3314. The fans 333 are sandwiched between the position plates 3312 and aligned with the corresponding ventilation holes 3314. Each side plate 313 defines a plurality of vents 3131 above the receiving shell 331. Two tabs 317 protrude from two opposite ends of the vents 3131 of an inner surface of each side plate 313. The front plate 315 defines a plurality of vents 318. The rear plate 316 defines a plurality of vents 319. The hard disk drives 35 are located between the rear plate 316 and the receiving shell 331, and the motherboard 36 is located between the front plate 318 and the receiving shell 331.

The air absorbing apparatus 45 comprises an air distributing tube 451 and two fans 453 mounted to two opposite ends of the air distributing tube 451. The air distributing tube 451 comprises a substantially rectangular bottom plate 4511, two opposite side plates 4513 substantially perpendicularly extending up from two opposite sides of the bottom plate

4511, two pieces 4515 substantially perpendicularly extending out from two opposite ends of each side plate 4513. One of the side plates 4513 defines a plurality of air outlets 4516 arranged along a lengthwise direction of the side plate 4513. A bottom end of each piece 4515 defines a substantially V-shaped cutout 4517.

In assembly of each absorbing apparatus 45 to the corresponding server 30, the air absorbing apparatus 45 is received in the server 30, two ends of the air distributing tube 451 are aligned with the vents 3131 of the side plate 313, and the air outlets 4516 of the air distributing tube 451 face the hard disk drives 35. The tabs 317 of each side plate 313 are latched in the corresponding cutouts 4517, and the bottom plate 4511 is supported on the receiving shell 331. Thus, the air absorbing apparatus 45 is mounted in the server 30, and the fans 453 of the air absorbing apparatus 45 are aligned with the corresponding vents 3131.

Figure 3:
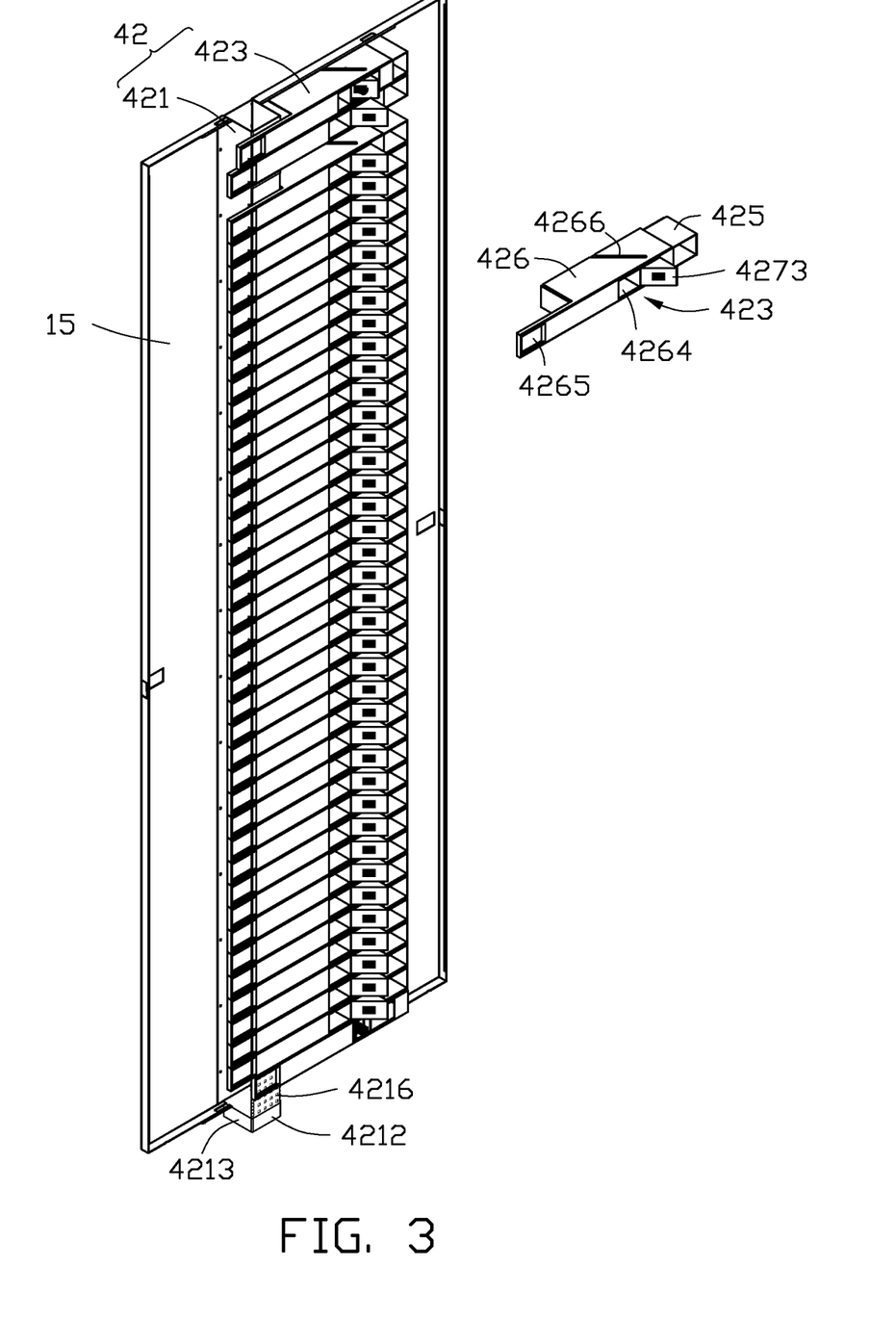
FIG. 3 is an enlarged, isometric view of one of the ventilation apparatuses of FIG. 1, wherein each ventilation apparatus includes a plurality of adjusting apparatuses.

FIG. 3 illustrates that each ventilation apparatus 42 comprises an air inlet tube 421 vertically mounted on an inner surface of the corresponding side wall 15 and a plurality of adjusting apparatus 423 mounted on the inner surface of the side wall 15 adjacent to the air inlet tube 421. The adjusting apparatus 423 are arrayed along the extension direction of the air inlet tube 421. Each adjusting apparatus 423 is perpendicular to the air inlet tube 421. A top end of the air inlet tube 421 extends through a top side of the side wall 15 and is aligned with the corresponding first through hole 131 of the top wall 13, and a bottom end of the air inlet tube 421 extends through a bottom side of the side wall 15 and is aligned with the corresponding second through hole 111 of the bottom wall 11. The air inlet tube 421 comprises a substantially rectangular connecting plate 4212 parallel to and spaced from the side wall 15 and two side plates 4213 substantially perpendicularly extending from two opposite sides of the connecting plate 4212 connected to the sidewall 15. The connecting plate 4212 defines a plurality of air outlets 4216.

Figure 4:
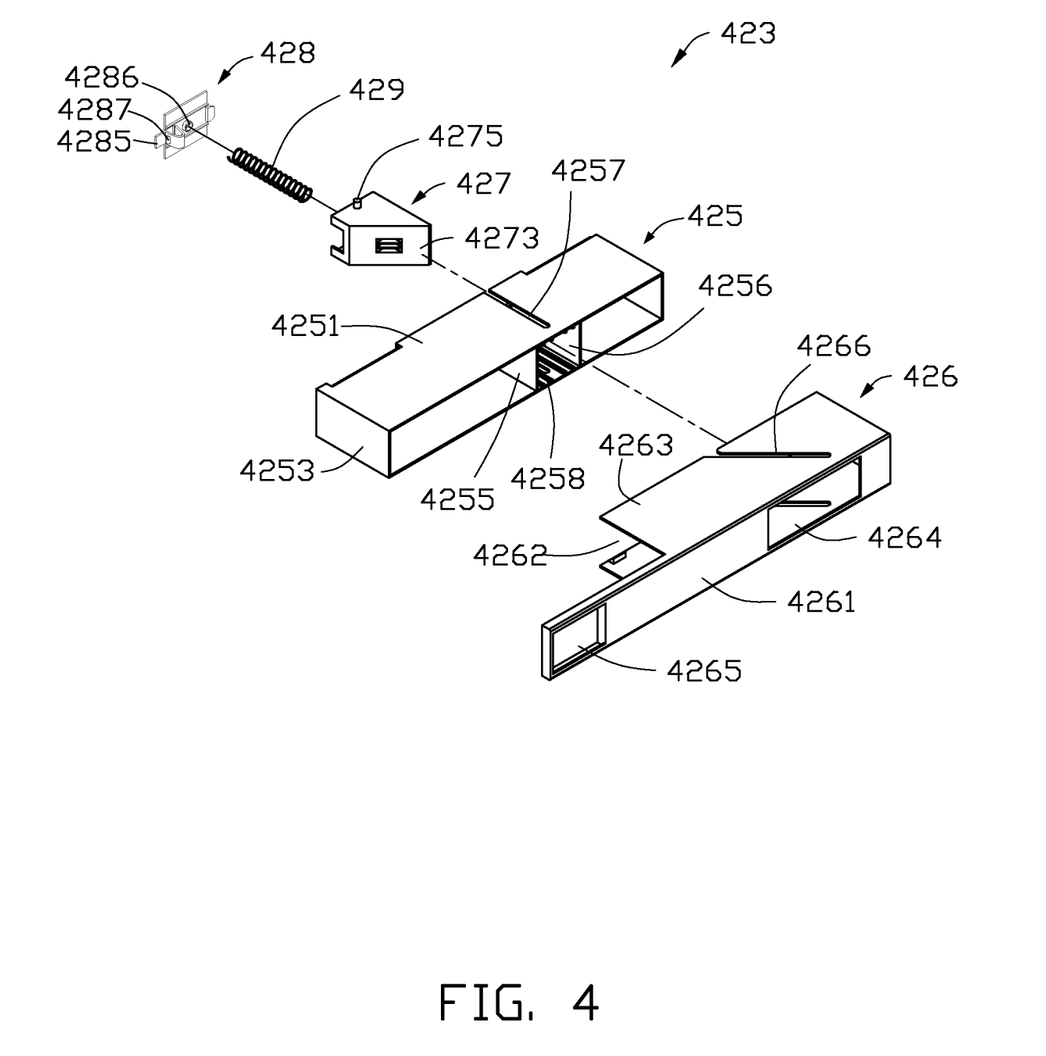
FIG. 4 is an exploded, isometric view of one of the adjusting apparatuses of FIG. 3.
Figure 5:
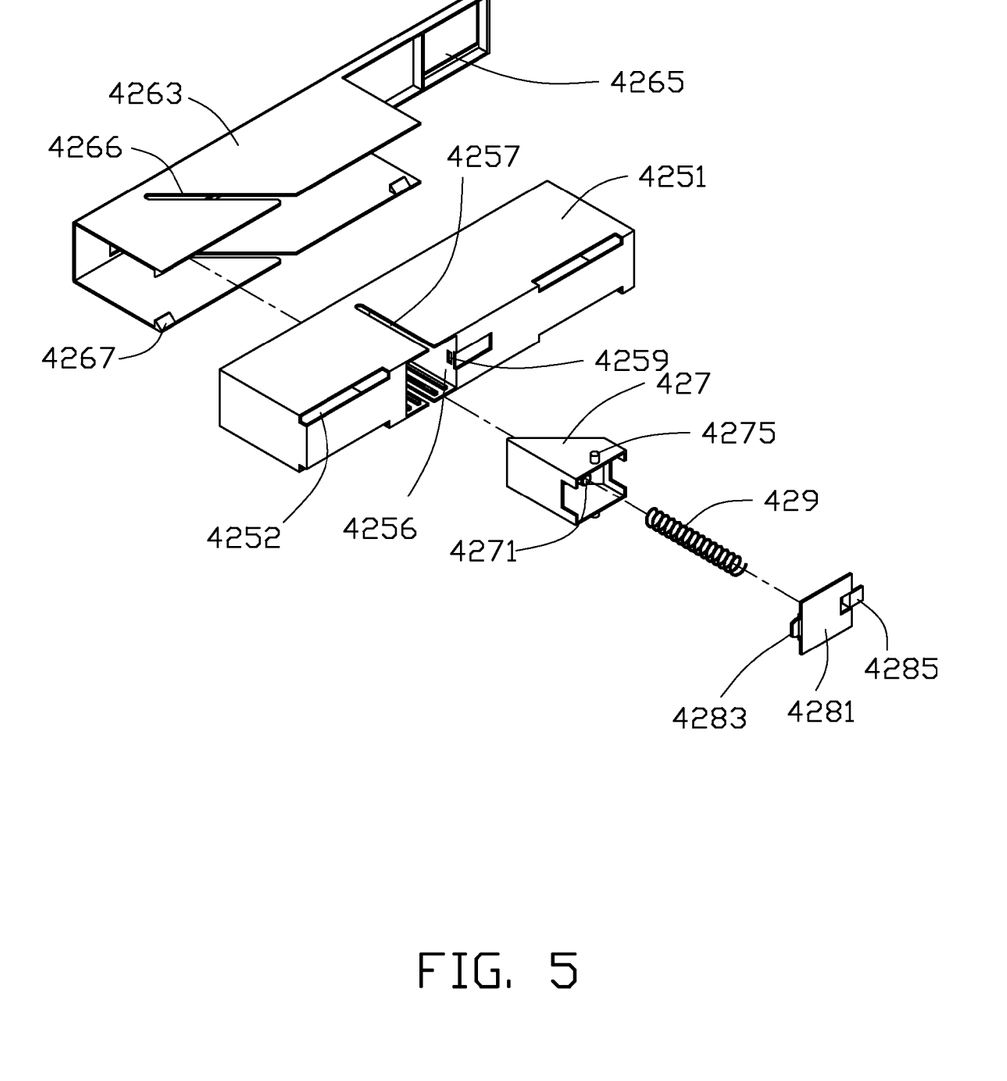
FIG. 5 is similar to FIG. 4, but viewed from another angle.

FIGS. 4-5 illustrate that each adjusting apparatus 423 comprises a substantially rectangular position shell 425, a sliding bracket 426, a sliding block 427, a latching member 428, and a resilient member 429.

The position shell 425 comprises two parallel and spaced side plates 4251, two end plates 4253 substantially perpendicularly connected between opposite ends of the side plates 4251, and two spaced partition plates 4255 coupled between the side plates 4251. The side plates 4251 and the partition plates 4255 cooperatively bound a receiving space 4256. Each side plate 4251 defines a slide slot 4257 between the partition plates 4255 and parallel to the partition plates 4255, and an end of the slide slot 4257 extends through a first side of the corresponding side plate 4251 to form an inlet. A plurality of guiding bars 4258 protrudes from each side plate 4251 between the partition plates 4255 toward the receiving space 4256. Each guiding bar 4258 is parallel to the slide slot 4257. The partition plates 4255 define two opposite latching holes 4259 adjacent to the openings of the slide slots 4257. Two opposite ends of the first side of each side plate 4251 define two guiding slots 4252 perpendicular to the slide slots 4257.

The sliding bracket 426 comprises a substantially rectangular shielding plate 4261 and two opposite supporting plates 4263 substantially perpendicularly extending from rear ends of opposite sides of the shielding plate 4261. The shielding plate 4261 and the supporting plates 4263 cooperatively bound a receiving space 4262. A rear end of the shielding plate 4261 defines a substantially rectangular adjusting slot 4264, and a front end of the shielding plate 4261 defines an opening 4265. The adjusting slot 4264 is located between the supporting plates 4263, and extends along a lengthwise direction of the shielding plate 4261. Each supporting plate 4263 defines an operating slot 4266 slantingly extending forward and away from the shielding plate 4261 beside the adjusting slot 4264. An end of each operating slot 4266 away from the shielding plate 4261 extends through a side of the corresponding supporting plate 4263 to form an inlet. The end of each operating slot 4266 away from the shielding plate 4261 is closer to the air inlet tube 421 than the other end of the operating slot 4266 adjacent to the shielding plate 4261. Two sliding blocks 4267 protrude from two opposite ends of the side of each supporting plate 4263 toward the receiving space 4262.

The sliding block 427 comprises a positioning pole 4271. A slanted abutting surface 4273 is formed on an end of the sliding block 427 facing away from the positioning pole 4271. Two opposite sliding poles 4275 substantially perpendicularly extend out from two opposite sides of the sliding block 427.

The latching member 428 comprises a substantially rectangular positioning piece 4281, a latching portion 4283 protruding out from a first end of the positioning piece 4281, and a resilient installing portion 4285 protruding out from a second end of the positioning piece 4281 opposite to the latching portion 4283. A positioning pole 4286 substantially perpendicularly extends from a middle of the connecting piece 4281. A protuberance 4287 protrudes from the installing portion 4285.

In at least one embodiment, the resilient member 429 is a spring.

Figure 6:
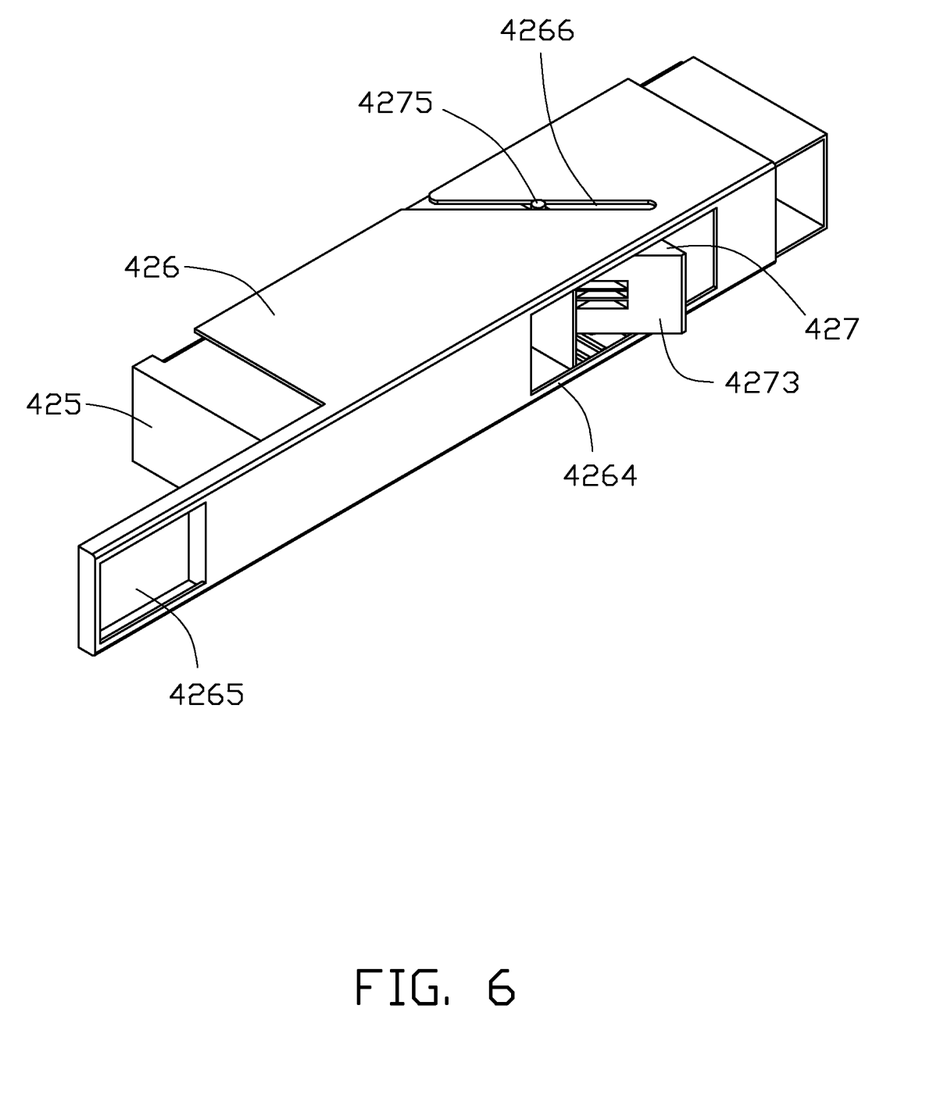
FIG. 6 is an assembled, isometric view of the adjusting apparatus of FIG. 4.

FIGS. 4-6 illustrate that the adjusting apparatus 423. In assembly of the adjusting apparatus 423, the side of the position shell 425 away from the sliding slots 4252 is inserted into the receiving space 4262. Two opposite outer surfaces of the side plates 4251 slidably abut against the sliding blocks 4267, to deform the supporting plates 4263. The supporting plates 4263 move away from each other, until the sliding blocks 4267 align with the sliding slots 4252, the supporting plates 4263 are restored to urge the sliding blocks 4267 to insert in the corresponding sliding slots 4252. Thus, the sliding bracket 426 is substantially slidably fitted about the position shell 425 along the sliding slots 4252. The sliding bracket 426 is slid, to allow the inlet of each operating slot 4266 to align with the inlet of the corresponding slide slot 4257 and the adjusting slot 4264 to align with the receiving space 4256. A first end of the resilient member 429 is mounted to the positioning pole 4271 of the sliding block 427, and a second end of the resilient member 429 is mounted to positioning pole 4286 of the latching member 428. The end of the sliding block 427 forming the abutting surface 4273 is inserted into the receiving space 4256 of the position shell 425, the sliding poles 4275 of the sliding block 427 are inserted into the operating slots 4266 and the slide slots 4257 from the corresponding inlets of the operating slots 4266 and the slide slots 4257, and the abutting surface 4273 of the sliding block 427 faces the opening 4265 of the sliding bracket 426. The sliding block 427 is slid to extend through the adjusting slot 4264 along the guiding bars 4258 of the side plates 4251, the sliding poles 4275 slidably abut against inner surfaces of the corresponding operating slots 4266 to slide the sliding bracket 426 forward relative to the position shell 425, until the latching portion 4283 of the latching member 428 is latched in the corresponding latching hole 4259 of the position shell 425. The installing portion 4285 is deformed until the protuberance 4287 aligns with the corresponding latching hole 4259. The installing portion 4285 is restored to urge the protuberance 4287 to latch in the corresponding latching hole 4259. Thus, the resilient member 429 is resiliently sandwiched between the sliding block 427 and the latching member 428, the sliding poles 4275 are stopped by distal ends of the slide slots 4257 and the operating slot 4266, and the abutting surface 4273 is exposed out of the adjusting slot 4264.

Figure 7:
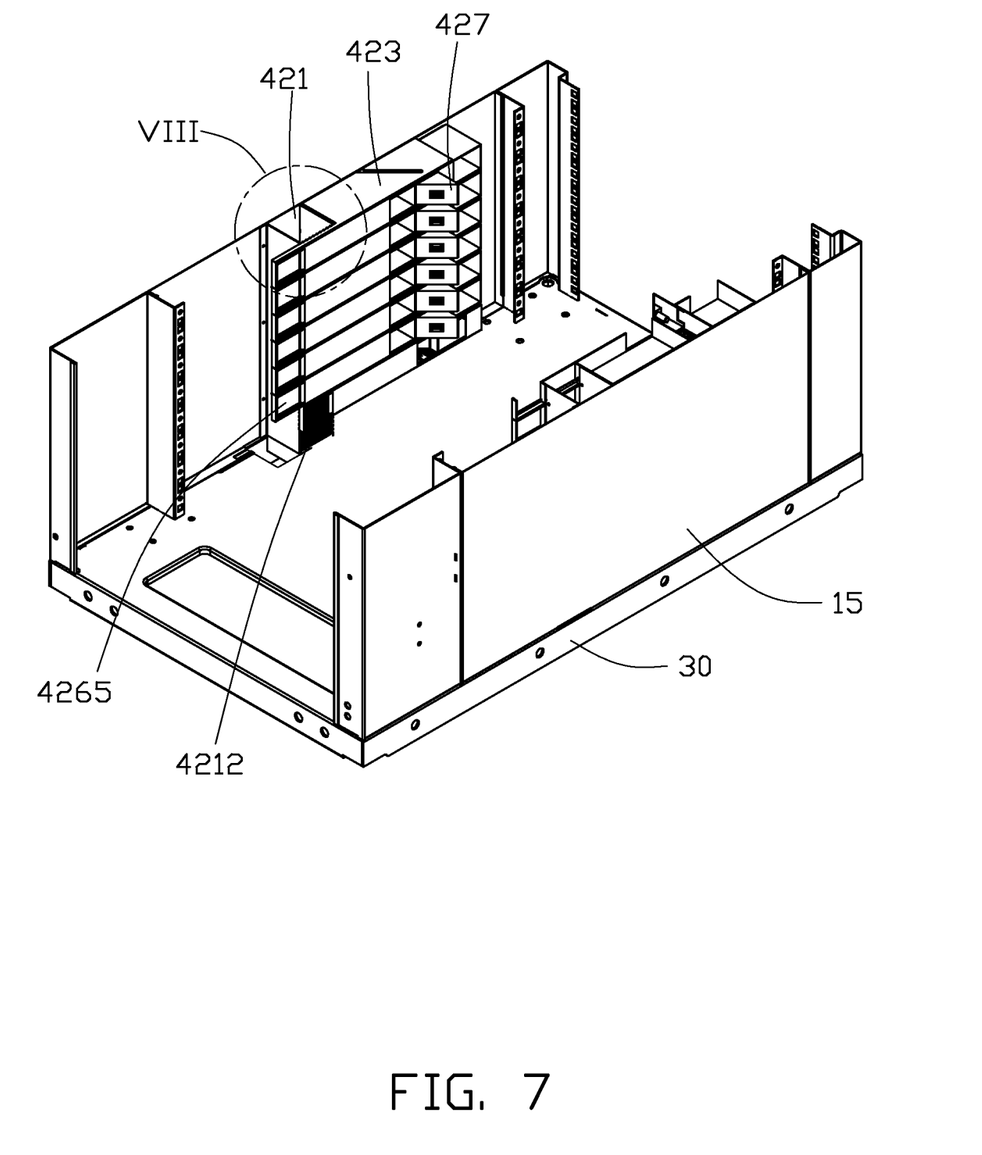
FIG. 7 is an assembled, isometric view of a cutaway of the cabinet of FIG. 1.
Figure 8:
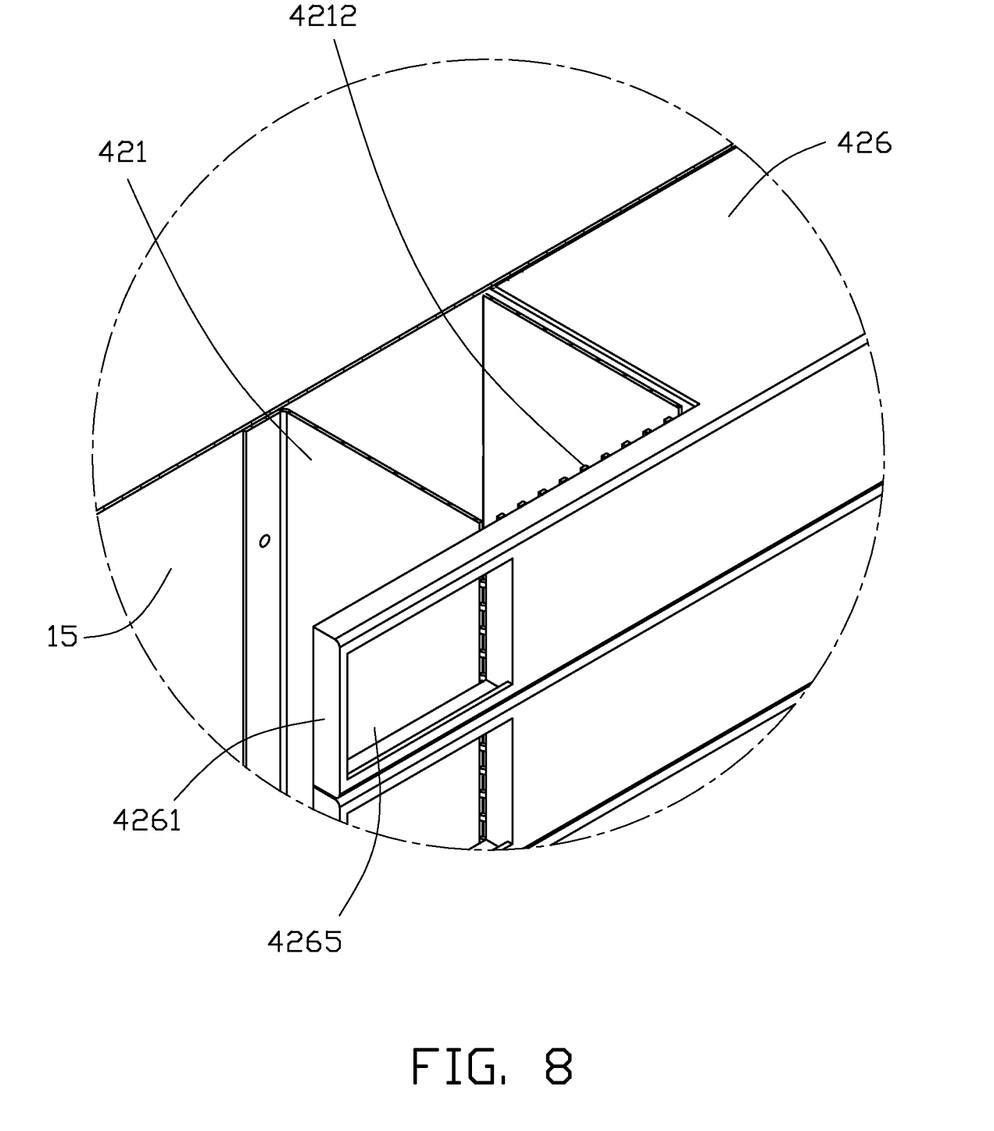
FIG. 8 is an enlarged, isometric view of a circled portion VIII of FIG. 7.

FIGS. 7-8 illustrate that the adjusting apparatuses 423 are installed to the corresponding side walls 15. The position shell 425 of each adjusting apparatus 423 is mounted to the inner surface of the corresponding side wall 15, behind the air inlet tube 421, and a part of the shielding plate 4261 between the opening 4265 and the adjusting slot 4264 covers the corresponding air outlets 4216 of the air inlet tube 421. The abutting surface 4273 of each adjusting apparatus 423 faces the front end of the cabinet 10.

Figure 9:
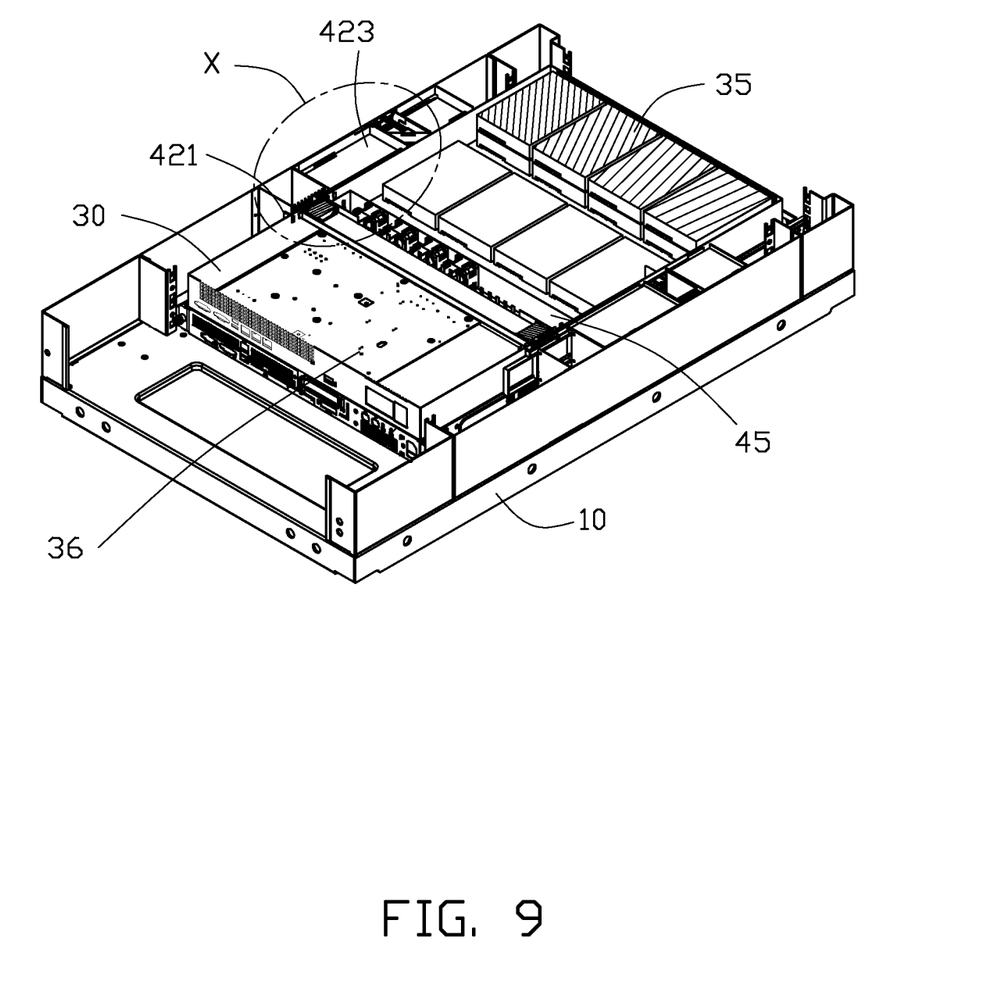
FIG. 9 is similar to FIG. 7, but shows the ventilation apparatuses in use.
Figure 10:
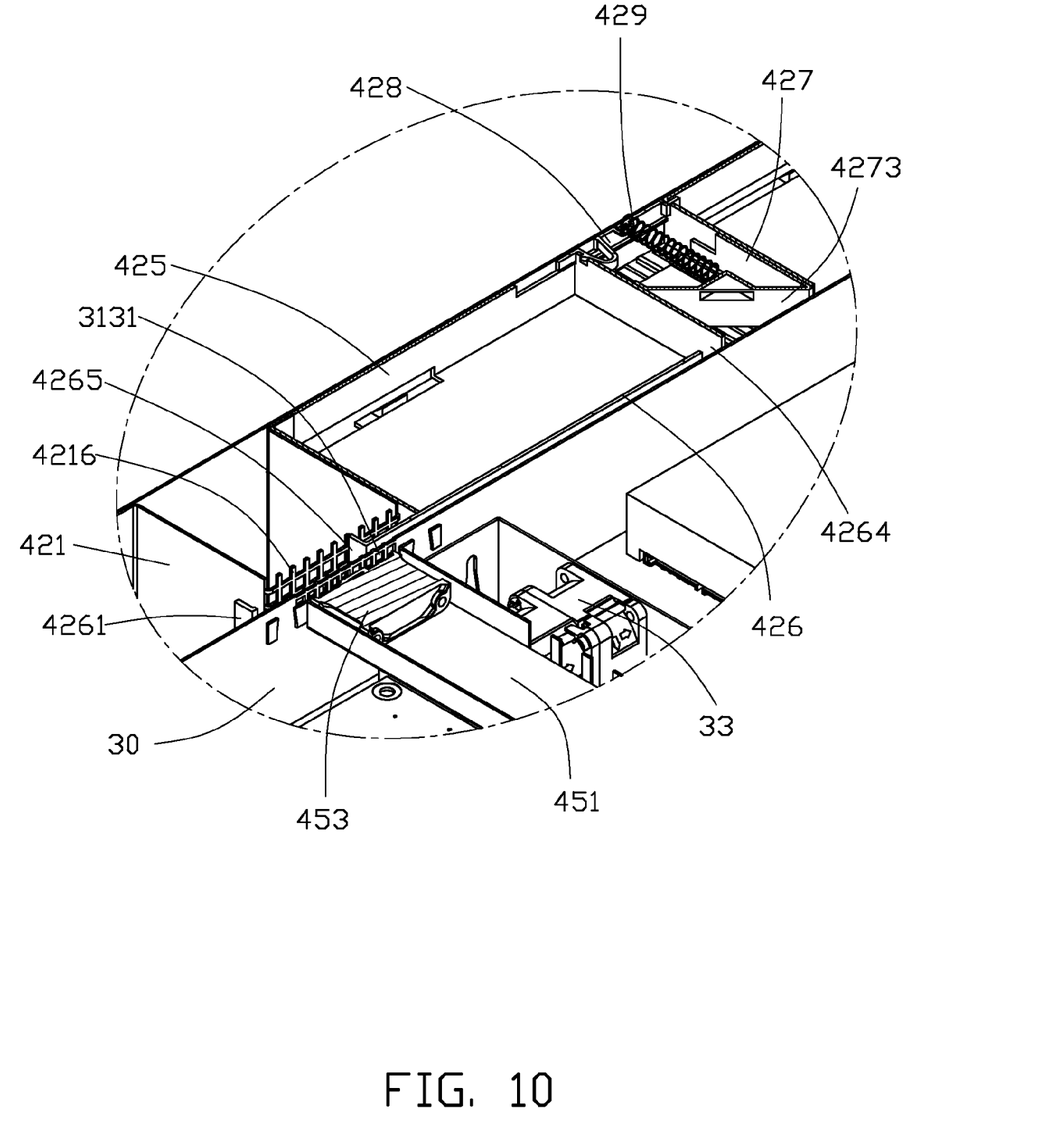
FIG. 10 is an enlarged, isometric view of a circled portion X of FIG. 9.

FIGS. 9-10 illustrate the server cabinet in use, a plurality of rails (not shown) is received in the cabinet 10 and installed to the corresponding supporting poles 12. A rear end of each server 30 is inserted into the cabinet 10 from the front end of the cabinet 10 through the corresponding rails. Two opposite ends of the rear plate 316 of each server 30 slidably abut against the abutting surfaces 4273 of the corresponding adjusting apparatuses 423, to slide the corresponding sliding blocks 427 toward the corresponding side walls 15 to deform the resilient members 429. The sliding poles 4275 slidably abut against the inner surfaces of the operating slots 4266 of the corresponding sliding brackets 426, to slide the sliding brackets 426 rearward until the opening 4265 of each sliding bracket 426 aligns with the corresponding air outlets 4216 of the corresponding air inlet tube 421. The server 30 further slides toward the rear end of the cabinet 10, and the sliding blocks 427 slidably abut against the side plates 313, until the server 30 is entirely installed in the cabinet 10. The vents 3131 of each server 30 are aligned with the openings 4265 of the corresponding sliding brackets 426 and the air outlets 4216 of the corresponding air inlet tubes 421. Thereby, the air distributing tube 451 of each server 30 is communicated with the air inlet tubes 421.

The servers 30 are used in the cabinet 10, the fans 333 of each server 30 drive cool air to flow into the server 30 through the vents 318 of the front plate 315. The cool air passes through the mother board 36, the dissipating assembly 33, and the hard disk drivers 35 and becomes heated air by heat exchanging with the mother board 36 and the hard disk drivers 35. The heated air can flow out of the server 30 through the vents 319 of the rear plate 316. The fans 453 of each air absorbing apparatus 45 drive cool air out of the cabinet 10 to flow into the air inlet tube 421 through the first though holes 131 and the second though holes 111, and the cool air flows into the air distributing tube 451 through the air outlets 4216 of the air inlet tubes 421, the vents 3131 of the side plates 313, and the fans 453. The cool air flows into the server 30 through the air outlets 4516 of the air absorbing apparatus 45, and passes through the hard disk drivers 35 and becomes heated air by heat exchanging with the hard disk drives 35. The heated air can flow out of the server 30 through the vents 319 of the rear plate 316.

In another embodiment, the sliding blocks 427 can be omitted. Another sliding block is configured to protrude from each shielding plate 4261, each server 30 is inserted into the cabinet 10, and the server 30 slidably abuts against the abutting plate to slide the sliding bracket 426 along a fore-and-aft direction of the cabinet 10.

Even though numerous characteristics and advantages of the embodiments have been set forth in the foregoing description, together with details of the structure and function of the embodiments, the present disclosure is illustrative only, and changes may be made in detail, including in the matters of shape, size, and arrangement of parts within the principles of the embodiments to the full extent indicated by the broad general meaning of the terms in which the appended claims are expressed.

What is claimed is:

1. A server cabinet comprising:
    a cabinet;
    a plurality of servers configured to be received in the cabinet; and
    a ventilation system comprising an air inlet tube mounted to a side of the cabinet, a plurality of air distributing tubes received in the servers, and a plurality of adjusting apparatus adjacent to the air inlet tube,
    wherein the air inlet tube defines a plurality of first air outlets aligning with the servers, each sever defines a vent communicating with the corresponding air inlets of the air inlet tube, an end of each air distributing tube is communicated with the vent of the corresponding server, a side of each air distributing tube defines a plurality of second air outlets communicating with the corresponding server, each adjusting apparatus comprises a sliding bracket covering the corresponding first air outlets of the air inlet tube and configured to be slidable relative to the air inlet tube, a sliding block coupled to each sliding bracket, and a resilient member to restore the corresponding sliding bracket, when one of the servers is inserted into the cabinet, the server abuts against the corresponding sliding block to slide the sliding bracket away from the air inlet tube, until the corresponding first air outlets of the air inlet tube aligns with the vent of the corresponding server and the air distributing tube, the resilient member is deformed, cool air out of the cabinet flows into the corresponding air distributing tube though the corresponding first air outlets of the air inlet tube and the vent of the server and flows into the server through the second air outlets of the corresponding air distributing tube.

2. The server cabinet of claim 1, wherein each adjusting apparatus further comprises a position shell mounted to the cabinet adjacent to the air inlet tube, each sliding bracket is slidably coupled to the corresponding position shell, and each sliding bracket comprises a shielding plate configured to shield the corresponding first air outlets of the air inlet tube.

3. The server cabinet of claim 2, wherein each sliding bracket is slidably fitted about the corresponding position shell, each sliding block is slidably received in the corresponding position shell and slidable along a direction perpendicular to an inserting direction of the servers, the resilient members are sandwiched between the sliding blocks and the position shells, a first end of each sliding block is exposed out the corresponding position shell and the sliding bracket to abut against the corresponding server.

4. The server cabinet of claim 3, wherein each sliding bracket slantingly defines an operating slot, each sliding block comprises a sliding pole configured to slide in the corresponding operating slot, when one of server is inserted into the cabinet, the one of server abuts against the corresponding sliding block to slide the sliding block away from the server, the sliding pole of the sliding block abuts against an inner surface of the corresponding operating slot, to slide the corresponding sliding bracket away from the air inlet tube, until the corresponding first air outlets of the air inlet tube align with the vent of the one of server.

5. The server cabinet of claim 4, wherein each position shell comprises two opposite side plates and two spaced partition plates coupled between the side plates, the side plates and the partition plates cooperatively bound an installing space, the sliding block is slidably received in the installing space of the position shell.

6. The server cabinet of claim 5, wherein each sliding bracket comprises two opposite supporting plates slidably engaged with outer surfaces of the side plates of the corresponding position shell, the supporting plates extend out from two opposite sides of an end of the corresponding shielding plate, each operating slot is defined in one of the supporting plates, each shielding plate defines an adjusting slot aligning with the installing space of the corresponding position shell, the first end of the sliding block extends through the adjusting slot of the sliding bracket.

7. The server cabinet of claim 6, wherein one of the side plates of each position shell adjacent to the operating slot defines a slide slot communicating with the installing space and extending perpendicular to the shielding plate of the corresponding sliding bracket, each sliding pole is slidably extended through the corresponding slide slot and received in the corresponding operating slot.

8. The server cabinet of claim 7, wherein an end of each slide slot away from the corresponding shielding plate extends through a side edge of the corresponding side plate of the position shell, an end of each operating slot away from the shielding plate extends through a side edge of the corresponding supporting plate.

9. The server cabinet of claim 7, wherein an end of each operating slot away from the corresponding shielding plate is closer to the air inlet tube than the other end of the operating slot adjacent to the shielding plate.

10. The server cabinet of claim 2, wherein each shielding plate defines an opening adjacent to the air inlet tube, the opening is configured to communicate with the corresponding first air outlets of the air inlet tube and the vent of the corresponding server.

11. The server cabinet of claim 3, wherein the first end of each sliding block slantingly forms an abutting surface facing the air inlet tube, each server slidably abuts against the abutting surface of the corresponding sliding block to slide the sliding block, and the sliding block drives the corresponding sliding bracket to slide.

12. A server cabinet comprising:
a bottom side;
a top side opposite to and substantially parallel to the bottom side;
a first side wall positioned between the top side and the bottom side;
a second side wall opposite to and substantially parallel to the first side wall;
a first air inlet tube with a plurality of air outlets;
a second air inlet tube with a plurality of air outlets; and
a plurality of pairs of adjusting apparatuses;
wherein, the first side wall and second side wall are each substantially perpendicular to the bottom side and the top side;
wherein, the first air inlet tube is attached to the first side wall and extends from the bottom side to the top side, the second air inlet tube is attached to the second side wall and extends from the bottom side to the top side and the top side and the bottom side are each configured with an opening to receive the first air inlet tube and the second air inlet tube;
wherein, one air adjusting apparatus of each pair of adjusting apparatuses is mounted on the first side wall substantially perpendicular to the first air inlet tube and in line with one of the plurality of first air inlet tube air outlets, with the other air adjusting apparatus of the pair of adjusting apparatuses mounted on the second side wall substantially perpendicular to the second air inlet tube and in line with one of the plurality of second air inlet tube air outlets;
wherein, each air adjusting apparatus comprises a slidable shielding plate substantially covering one of the plurality of the air inlet tube air outlets;
wherein, when servers are received in the cabinet between the first side wall and the second wall, a pair of adjusting apparatuses is activated with each shielding plate sliding to uncover an air inlet tube air outlet; and
wherein, each server positioned in the cabinet is configured to allow air to flow between the air outlet uncovered in the first air inlet tube and the second air inlet tube.

13. The server cabinet of claim 12, wherein each server comprises an air distributing tube received in the server, and two opposite ends of the air distributing tube communicate with the first air inlet tube and the second air inlet, the air distributing tube defines a plurality of air outlets communicating with the server.

14. The server cabinet of claim 12, wherein each pairs of adjusting apparatuses further comprise two position shells mounted to the first side wall and the second side wall and two sliding brackets slidably coupled to the position shells, each shielding plate is formed the corresponding sliding bracket.

15. The server cabinet of claim 14, wherein each sliding bracket slantingly defines an operating slot, each adjusting apparatuses comprises a sliding block, the sliding block comprises a sliding pole configured to slide in the operating slot, when one of server is inserted into the cabinet, the one of server abuts against the corresponding sliding block to slide the sliding block away from the one of server, the sliding pole of the sliding block abuts against an inner surface of the corresponding operating slot, to slide the corresponding sliding bracket away from the air inlet tube, until the corresponding air outlets of the first air inlet tube and the second air inlet tube communicate with the one of server.

16. The server cabinet of claim 15, wherein each position shell comprises two opposite side plates and two spaced partition plates coupled between the side plates, the side plates and the partition plates cooperatively bound an installing space, the sliding block is slidably received in the installing space of the position shell.

17. The server cabinet of claim 16, wherein each sliding bracket comprises two opposite supporting plates slidably engaged with outer surfaces of the side plates of the corresponding position shell, the supporting plates extend out from two opposite sides of an end of the corresponding shielding plate, each operating slot is defined in one of the supporting plates, each shielding plate defines an adjusting slot aligning with the installing space of the corresponding position shell, the first end of the sliding block extends through the adjusting slot of the sliding bracket.

18. The server cabinet of claim 17, wherein one of the side plates of each position shell adjacent to the operating slot defines a slide slot communicating with the installing space and extending perpendicular to the shielding plate of the corresponding sliding bracket, each sliding pole is slidably extended through the corresponding slide slot and received in the corresponding operating slot.

19. The server cabinet of claim 18, wherein an end of each slide slot away from the corresponding shielding plate extends through a side edge of the corresponding side plate of the position shell, an end of each operating slot away from the shielding plate extends through a side edge of the corresponding supporting plate.

20. The server cabinet of claim 18, wherein an end of each operating slot away from the corresponding shielding plate is closer to the air inlet tube than the other end of the operating slot adjacent to the shielding plate.

* * * * *